US012581976B2

(12) United States Patent
Boo et al.

(10) Patent No.:   US 12,581,976 B2
(45) Date of Patent:      Mar. 17, 2026

(54) WIRE BONDING DIRECTLY ON EXPOSED CONDUCTIVE VIAS AND INTERCONNECTS AND RELATED SYSTEMS AND METHODS

(71) Applicant: Micron Technology, Inc., Boise, ID (US)

(72) Inventors: Kelvin Tan Aik Boo, Singapore (SG); Seng Kim Ye, Singapore (SG); Hong Wan Ng, Singapore (SG); Ling Pan, Singapore (SG); See Hiong Leow, Singapore (SG)

(73) Assignee: Micron Technology, Inc., Boise, ID (US)

( * ) Notice: Subject to any disclaimer, the term of this patent is extended or adjusted under 35 U.S.C. 154(b) by 700 days.

(21) Appl. No.: 17/899,550

(22) Filed: Aug. 30, 2022

(65) Prior Publication Data

US 2024/0071980 A1      Feb. 29, 2024

(51) Int. Cl.
H01L 23/48           (2006.01)
H01L 21/48           (2006.01)
(Continued)

(52) U.S. Cl.
CPC .......... *H01L 24/48* (2013.01); *H01L 21/4857* (2013.01); *H01L 21/486* (2013.01); *H01L 23/49822* (2013.01); *H01L 23/49838* (2013.01); *H01L 24/32* (2013.01); *H01L 24/73* (2013.01); *H01L 25/0657* (2013.01); *H01L 23/49816* (2013.01); *H01L 2224/32145* (2013.01); *H01L 2224/32225* (2013.01); *H01L 2224/48235* (2013.01); *H01L 2224/73215* (2013.01); *H01L 2224/73265* (2013.01);
(Continued)

(58) Field of Classification Search
CPC ... H01L 24/48; H01L 21/4857; H01L 21/486; H01L 23/49822; H01L 23/49838; H01L 24/32; H01L 24/73; H01L 25/0657; H01L 23/49816; H01L 2224/32145; H01L 2224/32225; H01L 2224/48235; H01L 2224/73215; H01L 2224/73265; H01L 2225/0651; H01L 2225/06524; H01L 2225/06548; H01L 2225/06562; H01L 2924/1434; H01L 2924/3512; H01L 2225/06586; H01L 23/5384; H01L 21/76877; H01L 21/76895; H01L 23/5386; H01L 24/43; H01L 2224/43; H01L 2224/48221
USPC ........................................................ 257/784
See application file for complete search history.

(56) References Cited

U.S. PATENT DOCUMENTS

2019/0259737 A1*   8/2019   Song .................... H01L 23/5383

\* cited by examiner

*Primary Examiner* — Theresa T Doan
(74) *Attorney, Agent, or Firm* — Dorsey & Whitney LLP

(57)                    ABSTRACT

Stacked semiconductor devices, and related systems and methods, are disclosed herein. In some embodiments, the stacked semiconductor device includes a package substrate having at least a first layer and a second layer, an interconnect extending through the package substrate, a stack of dies carried by the package substrate, and one or more wirebonds electrically coupling the stack of dies to package substrate. Each of the layers of the package substrate can include a section of the interconnect with a frustoconical shape. Each of the sections can be directly coupled together. Further, the section in an uppermost layer of the package substrate is exposed at an upper surface of the package substrate. The wirebonds can be directly coupled to the exposed surface of the uppermost section.

18 Claims, 9 Drawing Sheets

(51) Int. Cl.
    *H01L 23/00*         (2006.01)
    *H01L 23/498*       (2006.01)
    *H01L 23/52*         (2006.01)
    *H01L 25/065*       (2023.01)

(52) U.S. Cl.
    CPC ................. *H01L 2225/0651* (2013.01); *H01L 2225/06524* (2013.01); *H01L 2225/06548* (2013.01); *H01L 2225/06562* (2013.01); *H01L 2924/1434* (2013.01); *H01L 2924/3512* (2013.01)

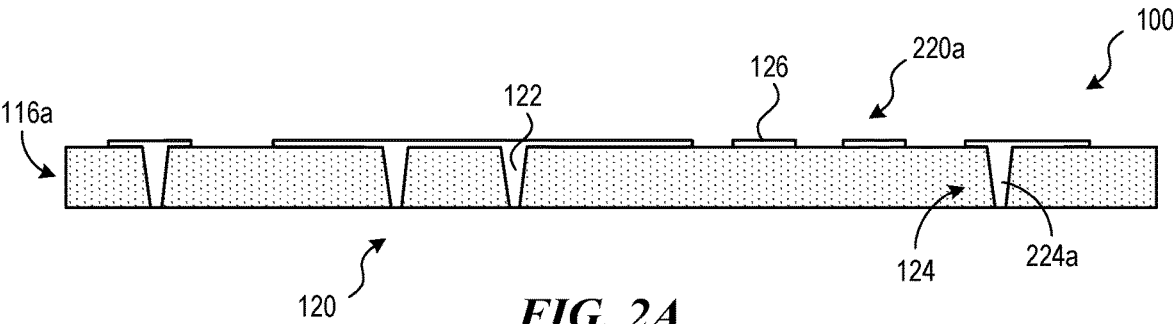
*FIG. 2A*
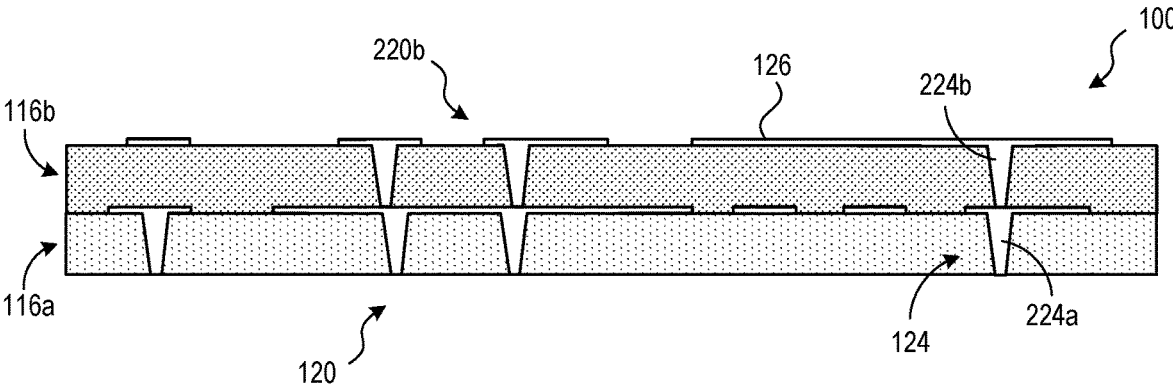
*FIG. 2B*
*FIG. 2C*

302

For each layer of substrate

304

Form layer of substrate

306

Laser drill layer

308

Fill laser drill-holes and form metallization layer

310

Next layer

312

Stack dies on substrate

314

Wirebond dies to substrate

316

Encapsulate die stack and wirebonds

WIRE BONDING DIRECTLY ON EXPOSED CONDUCTIVE VIAS AND INTERCONNECTS AND RELATED SYSTEMS AND METHODS

TECHNICAL FIELD

The present technology is generally related to systems and methods for reducing cracks in a solder mask. In particular, the present technology relates to opening patterns in solder masks that release stress and related systems and methods.

BACKGROUND

Microelectronic devices, such as memory devices, microprocessors, and other electronics, typically include one or more semiconductor dies mounted to a substrate and encased in a protective covering. The semiconductor dies include functional features, such as memory cells, processor circuits, interconnecting circuitry, etc. To meet continual demands on decreasing size, individual semiconductor dies and/or active components are typically manufactured in bulk and then stacked on a package substrate (e.g., a printed circuit board (PCB) or other suitable substrate). The package substrate can include one or more interconnects establishing electrical communication routes between a package connection side and a die-stacking side. The die-stacking side can include a bond finger electrically coupled between to the interconnect and a bond pad at the die stacking side, allowing the die stack to be electrically coupled to the interconnect. For example, the die stack can include wirebonds coupled between the dies and the bond pad, thereby completing an electrical communication route between the package connection side and each of the dies in the die stack.

BRIEF DESCRIPTION OF THE DRAWINGS

FIGS. 2A-2G are partially schematic cross-sectional views of illustrating a manufacturing process for a stacked semiconductor device in accordance with some embodiments of the present technology.

Figure 1A:
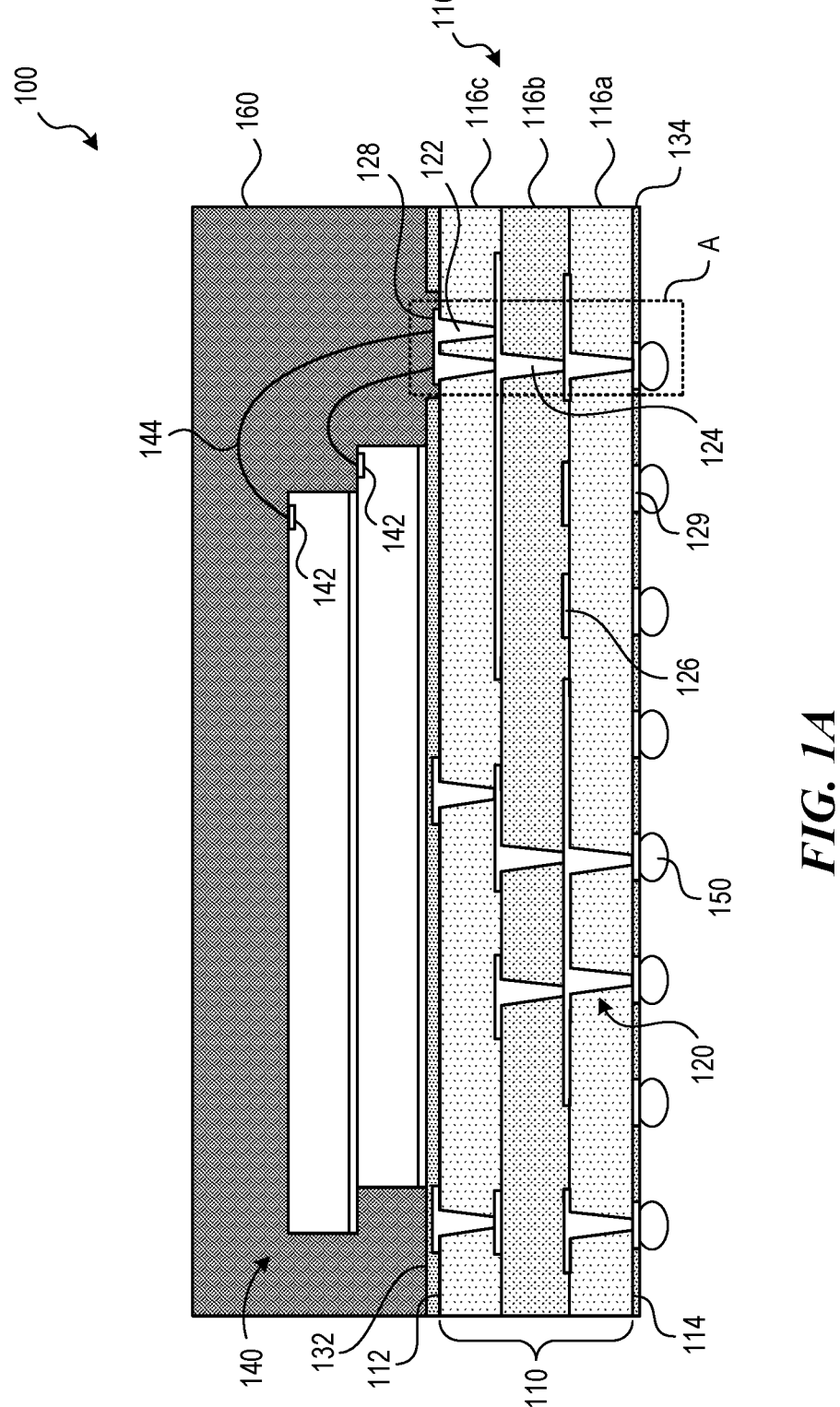
FIG. 1A is a partially schematic cross-sectional view of a stacked semiconductor device configured in accordance with some embodiments of the present technology.

The drawings have not necessarily been drawn to scale. Further, it will be understood that several of the drawings have been drawn partially schematically. Similarly, some components and/or operations can be separated into different blocks or combined into a single block for the purpose of discussing some of the implementations of the present technology. Moreover, while the technology is amenable to various modifications and alternative forms, specific implementations have been shown by way of example in the drawings and are described in detail below. The intention, however, is not to limit the technology to the particular implementations described.

DETAILED DESCRIPTION

A typical stacked semiconductor device includes a package substrate, an interconnect electrically coupling a first side of the package substrate to a second side of the package substrate, and a stack of dies carried by the first side. The interconnect is a hole in the package substrate that includes a conductive material on the walls of the hole providing the electrical connection and an insulating material in the center that reduces the cross-sectional area of the conductive material and protects the conductive material from corrosion. Because the conductive layer on the walls is relatively thin, the interconnect must then be coupled to bond fingers at the first and second ends of the package substrate. The bond fingers, in turn, are coupled to (or formed integrally with) bond pads for external connections. For example, the bond pads at the first surface can be coupled to the stack of dies, while the bond pads at the second surface can be coupled to package terminals (e.g., solder balls for coupling the package substrate to another component). However, the bond fingers and bond pads can corrode and/or otherwise be damaged. Additionally, they occupy real estate on the surfaces of the package substrate that could otherwise be used in signal routing lines (e.g., for trace matching, coupling active or inactive components, and the like) to increase the performance of the stacked semiconductor device and/or reduce the overall size of the stacked semiconductor device.

Stacked semiconductor devices, and related systems and methods, are disclosed herein to help address these problems. For example, a stacked semiconductor device in accordance with some embodiments herein can include a package substrate that has two or more layers (e.g., at least a first layer and a second layer). Each of the layers can include a conductive via and/or a section of an interconnect (sometimes also referred to herein a first segment). For example, the first layer can include (1) a first conductive via and/or (2) a first section of the interconnect having a first end with a first diameter and a second end with a second diameter larger than the first diameter. Similarly, the second layer can include (1) a second conductive via electrically coupled to the first conductive via (e.g., via a conductive trace) and/or (2) a second section of the interconnect having third end with a third diameter smaller than the second diameter and a fourth end with a fourth diameter larger than the third diameter. Each of the sections of the interconnect can be directly coupled to each other. For example, the third end of the second section can be directly coupled to the second end of the first section. Further, an uppermost end of the interconnect (e.g., the fourth end of the second section) is exposed at an upper surface of the package substrate. The stacked semiconductor device can also include a stack of dies carried by the upper surface of the package substrate, and one or more wirebonds electrically coupling the stack of dies to the fourth end of the second section of the interconnect.

In various embodiments, each of the one or more wirebonds can be electrically coupled directly to the fourth end of the second section of the interconnect and/or an upper surface of the conductive vias. In some embodiments, the upper surface of the conductive via (or the fourth end of the second section of the interconnect) is coupled to a layer of conductive material vertically aligned with and directly coupled to the upper surface. In such embodiments, the one or more wirebonds can be electrically coupled to the upper surface of the conductive via (or the fourth end of the second section of the interconnect) through the layer of conductive material. Further, in such embodiments, the layer of conductive material can have a footprint that is equal to or smaller than the footprint of the upper surface.

In some embodiments, various layers of the package substrate include one or more signal routing lines (sometimes also referred to herein as traces, redistribution layers, and/or metallization layers) formed thereon. For example, the uppermost layer of the package substrate (e.g., the second layer in the example above) can include a plurality of signal routing lines at the upper surface of the package substrate. In this example, the stacked semiconductor device can further include an insulation layer at least partially covering the plurality of routing lines. The insulation layer can electrically isolate the signal routing lines from the fourth end of the interconnect. Further, the signal routing lines can take advantage of the real estate available on the upper surface based on the direct (or nearly direct) coupling between the wirebonds and the interconnect. For example, the signal routing lines can be positioned at least partially under the stack of dies and/or at least partially longitudinally between the fourth end of the second section of the interconnect and the stack of dies.

In another example, the internal layers can include redistribution structures to take advantage of the real estate available within the package substrate. Returning to the two-layer example above, the first layer can include a redistribution layer (e.g., having one or more signal routing lines) that is electrically coupled to the interconnect within the package substrate. The redistribution layer can electrically couple the interconnect to various other structures in the stacked semiconductor device. For example, the second layer can include a laser-drilled via filled with a conductive material having an inner end coupled to the redistribution layer and an outer end exposed at the upper surface of the package substrate. In various embodiments, the outer end can be coupled to the stack of dies (e.g., through one or more additional wirebonds), various active components (e.g., capacitors), and/or various passive components. In some embodiments, the additional components are directly coupled to the outer end. For example, the stack of dies can further include one or more second wiredbonds electrically coupling the stack of dies to the outer end.

On the opposite surface of the package substrate (e.g., the lower surface), the stacked semiconductor device can include one or more bond pads that can be coupled to package terminals (e.g., solder balls to couple to another component). A lowermost section of the interconnect (e.g., the first section of the interconnect in the example above) is coupled directly to at least one of the bond pad(s) at the lower surface of the package substrate. As a result, the interconnect can define a straight signal line (e.g., having a minimum travel length) through the package substrate from the bond pad to the one or more wirebonds.

In some embodiments, the stacked semiconductor device includes a package substrate and one or more semiconductor dies (in one or more die stacks) placed on the package substrate. The package substrate can include one or more conductive vias formed therein. The conductive vias can be laser-drilled holes filled with a conductive material (e.g., copper, gold, nickel, and/or any other suitable material). In some embodiments, the conductive vias extend from an upper surface of the package substrate to a lower surface (e.g., when the package substrate includes only a single layer). In some embodiments, the package substrate includes two or more layers, with one or more conductive vias extending through individual ones of the two or more layers and electrically coupled by redistribution structures formed on each of the two or more layers. The stacked semiconductor device can also include one or more wirebonds that couple the one or more semiconductor dies directly to a top end of the conductive vias exposed at the upper surface of the package substrate. Said another way, each of the one or more wirebonds can be directly bonded to the conductive material in the conductive vias (e.g., without the inclusion of a bond finger or similar structure).

The stacked semiconductor device can be manufactured by a method that includes forming the package substrate with an interconnect, stacking one or more semiconductor dies on an upper surface of the package substrate adjacent to an exposed top surface of the interconnect, and forming one or more wirebonds between the one or more semiconductor dies and the top surface of the interconnect. The wirebond(s) can include a first portion coupled to a bond pad on one of the one or more semiconductor dies and a second portion directly coupled to the top surface. Further, the interconnect can include sections in N-number of layers (e.g., where N is an integer greater than one) of the package substrate that each have the frustoconical shape discussed above.

In some embodiments, forming the package substrate includes, for each of the N-number of layers, depositing a new layer of the package substrate, laser-drilling the new layer to create one or more vias in the layer, and depositing a conductive material into the one or more vias. At least one via in each of the N-number of layers is vertically aligned to form an individual section of the interconnect. Additionally, forming the package substrate can also include forming one or more conductive traces on one or more layers of the package substrate while depositing the conductive material into the one or more vias. The conductive traces can form redistribution routes to couple additional components of the stacked semiconductor device, provide space for trace matching for the die stack, and the like.

FIG. 1A is a partially schematic cross-sectional view of a stacked semiconductor device 100 configured in accordance with some embodiments of the present technology. In the illustrated embodiment, the stacked semiconductor device 100 ("device 100") includes a package substrate 110 that has a first surface 112 (e.g., an upper surface, a die stacking surface, and the like) and a second surface 114 (e.g., a lower surface, a package interconnection surface, and the like) opposite the first surface 112. The package substrate 110 also includes one or more layers 116 (three shown, referred to individually as "first-third layers 116a-116c") and a plurality of metallization structures 120 forming electrical connections through the package substrate 110. As illustrated in FIG. 1A, the metallization structures 120 can include one or more conductive vias 122; one or more interconnects 124 (one shown); one or more conductive traces 126; one or more die-bonding regions 128 formed on the first surface 112 of the package substrate 110; and one or more package-bonding regions 129 formed on the second surface 114 of the package substrate 110.

In some embodiments, the first-third layers 116a-116c of the package substrate 110 have varying thicknesses. For example, the first and third layers 116a, 116c (e.g., the outer layers) can have a first thickness ranging from about 5 micrometers (μm) to about 40 μm, or from about 10 μm to about 40 μm; while the second layer 116*b* (e.g., the core layer) can have a second thickness ranging from about 40 μm to about 200 μm, or from about 40 μm to about 150 μm. The additional thickness of the core layer can, for example, provide additional support for the metallization structures formed thereon and/or for the device 100 overall. In some embodiments, each of the first-third layers 116*a*-116*c* of the package substrate 110 has a generally equal thickness.

In some embodiments, each of the conductive vias 122 is a micro-via (e.g., resulting from a laser-drill process on a layer-by-layer basis). As a result, the conductive vias 122 can form an electrical connection (e.g., thereby defining a signal route) between the surfaces of the layers 116. For example, the conductive via 122 labelled in FIG. 1A forms an electrical connection between an upper surface of the third layer 116*c* and an upper surface of the second layer 116*b*. As a result, for example, the conductive vias 122 can couple one of the die-bonding regions 128 to a corresponding trace 126 within the package substrate 110. In turn, the trace 126 can be electrically coupled to any number of the conductive vias 122, others of the traces 126, and/or the interconnects 124. The series of electrical connections can eventually electrically couple the corresponding one of the die-bonding regions 128 to another one of the die-bonding regions 128 and/or one of the package-bonding regions 129 with a known signal route length.

Similarly, the interconnects 124 form an electrical connection (e.g., thereby defining a signal route) between the first and second surface 112, 114 of the package substrate 110. For example, the interconnect 124 illustrated in FIG. 1A forms a direct electrical connection between one of the die-bonding regions 128 and one of the package-bonding regions 129. The direct connection between one of the die-bonding regions 128 and one of the package-bonding regions 129 can provide a signal route with a minimum length (e.g., allowing for quick signal travel times).

As further illustrated in FIG. 1A, the device 100 can further include a first insulation layer 132 on the first surface 112, a second insulation layer 134 on the second surface 114, and a stack of one or more semiconductor dies 140 ("die stack 140," shown with two dies) carried over the first surface 112 by the first insulation layer 132. Each of the dies in the die stack 140 can include one or more bond pads 142 (one shown on each die) that are electrically coupled to the die-bonding regions 128 through wirebonds 144. Further, the device 100 can include an encapsulant 160 at least partially covering the die stack 140 and the wirebonds 144.

In the illustrated embodiment, the die-bonding regions 128 correspond to the upper surfaces of one of the conductive vias 122 and the interconnect 124. That is, the wirebonds 144 can be directly bonded to the upper surfaces of the conductive vias 122 and/or the interconnect 124. The direct bond can allow the device 100 to be constructed without, for example, a bond finger between the die-bonding regions 128 and the conductive vias 122 and/or the interconnect 124. This omission can shorten the length of the signal routing lines and reduce the conductive material exposed at the first surface 112 of the package substrate 110. As a result, the direct bond between the wirebonds 144 and the conductive vias 122 and/or the interconnect 124 can provide faster signal travel times and reduce the chance of corrosion (or other physical, electrical, and/or chemical damage) to the signal routing lines. Additionally, or alternatively, the direct bond between the wirebonds 144 and the die-bonding regions 128 can reduce the longitudinal space needed at the upper surface of the package substrate 110 to form the necessary electrical connections. This reduction in required space can be especially useful given the constant decrease in size of the package substrate 110. Purely by way of example, package substrates that are less than about 290 μm by about 290 μm, or less than about 90 μm by about 90 μm, can have extremely limited room for bond finger connections and therefore benefit from the direct coupling.

The direct bond between the wirebonds 144 and the conductive vias 122 and/or the interconnect 124 can be enabled by the laser-drilled formation process of the conductive vias 122 and the interconnect 124 in a layer-by-layer process. In particular, the laser-drilled formation at each layer 116 of the package substrate 110 allows the holes drilled by the laser to be completely filled with a conductive material (e.g., as opposed to the conductively lined through-substrate hole in traditional interconnects that are also filled with insulation materials, solder mask material, and the like). Said another way, because the laser drilled holes are exclusively filled with a conductive material, the upper surface of the resulting conductive vias 122 and/or interconnect 124 are suitable for bonding and targetable by the wirebonding process. Said yet another way, although the laser-drilled vias can have a significantly smaller longitudinal area than traditional through-substrate holes, the longitudinal area of the conductive material at the upper surface of the resulting conductive vias 122 and/or interconnect 124 can be larger than the area available on the perimeters of traditional through-substrate holes. As a result, the upper surface of the resulting conductive vias 122 and/or interconnect 124 can be targeted directly by a wirebonding process.

Figure 1B:
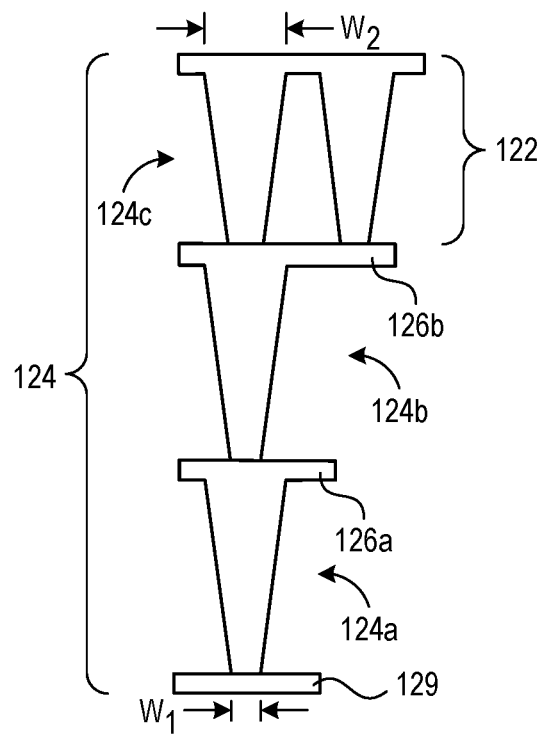
FIG. 1B is a partially schematic cross-sectional view of an interconnect structure for use in the stacked semiconductor device of FIG. 1A in accordance with some embodiments of the present technology.

For example, FIG. 1B is a partially schematic cross-sectional view of one of the conductive vias 122 and the interconnect 124 of FIG. 1A in accordance with some embodiments of the present technology. Corresponding layers 116 of the package substrate 110 (FIG. 1A) are omitted from FIG. 1B to avoid obscuring the illustrated features, however, it will be understood that the conductive vias 122 and the interconnect 124 are formed into the layers 116.

As illustrated in FIG. 1B, the interconnect 124 includes first-third sections 124*a*-124*c* individually corresponding to the first-third layers 116*a*-116*c* (FIG. 1A). Each of the first-third sections 124*a*-124*c* can be formed by filling a laser-drilled hole in a corresponding one of the layers 116 with a conductive material. As a result, each of the first-third sections 124*a*-124*c* has a first end (e.g., a upper end) that is wider than a second end (e.g., a lower end) based on a slope of the sidewalls from the laser-drilled hole. In the illustrated embodiment, each of the first-third sections 124*a*-124*c* has the same size, with the first end having a first width $W_1$ and the second end having a second width W2 that is smaller than the first width. In other embodiments, each of the first-third sections 124*a*-124*c* can have a different size. In such embodiments, however, each individual section will still have a first that is wider than a second end for that individual section. In a specific, non-limiting example, the each of the first-third sections 124*a*-124*c* of the interconnect 124 (and/or any of the conductive vias 122) can have a width that varies between about 30 micrometers (μm) and about 90 μm, or between about 50 μm and about 75 μm.

Similar to the first-third sections 124*a*-124*c* of the interconnect 124, the conductive via 122 can be formed by filling a laser-drilled hole in a corresponding one of the layers 116 (FIG. 1A) with a conductive material. As a result, the conductive via 122 also has a first end (e.g., a upper end) that is wider than a second end (e.g., a lower end) based on a slope of the sidewalls from the laser-drilled hole. In the illustrated embodiment, the conductive via 122 has a generally similar size to an individual section of the interconnect 124. In various other embodiments, the conductive via 122 can be larger (e.g., wider, longer, and the like) and/or smaller (e.g., narrower, shorter, and the like) than an individual section of the interconnect 124.

As further illustrated in FIG. 1B, various sections of the interconnect 124 and/or the conductive via 122 can be electrically coupled to the conductive traces 126 (sometimes also referred to herein as "signal routing lines"). For example, the first section 124a is electrically coupled to a first trace 126a. The first conductive trace 126a can couple the first section 124a to various other conductive structures in the device 100 (FIG. 1A), such as various active components, passive components, various other die-bonding regions 128, and/or various other package-bonding regions 129. In another example, the second section 124b is electrically coupled to a second trace 126b. In turn, the second trace 126b is electrically coupled to the conductive via 122. As a result, the second trace 126b provides a signal route line from the die-bonding region 128 at the top of the conductive via 122 to the package-bonding region 129 at the bottom of the interconnect.

Figure 1C:
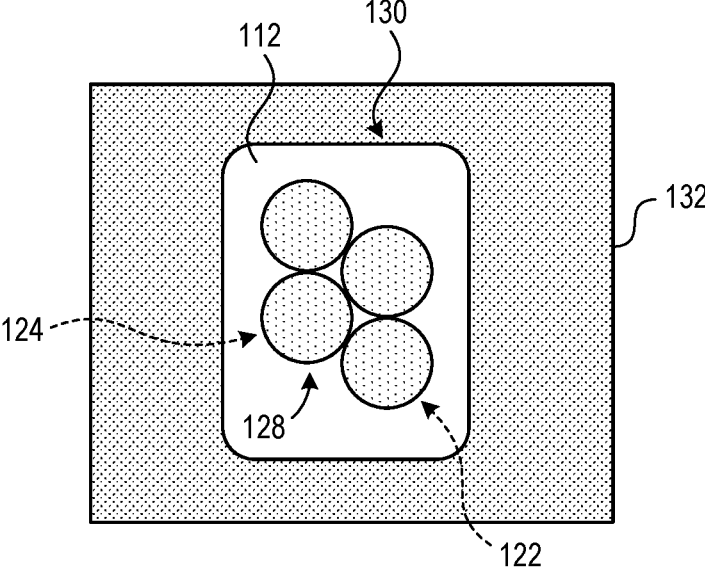
FIG. 1C is a partially schematic top view of bonding region for the stacked semiconductor device of FIG. 1A in accordance with some embodiments of the present technology.

FIG. 1C is a partially schematic top view of die-bonding regions 128 for the stacked semiconductor device of FIG. 1A in accordance with some embodiments of the present technology. As illustrated in FIG. 1C, the first insulation layer 132 can include one or more openings 133 (one shown) that exposes one or more of the die-bonding regions 128 of the metallization structures 120. As further illustrated, the die-bonding regions 128 correspond to the upper surfaces of the conductive vias 122 and/or the interconnects 124. That is, as discussed above, the die-bonding regions 128 provide a direct bond to the upper surfaces of the conductive vias 122 and/or the interconnects 124, without the need for a bond finger or other routing structure to create sufficient surface area for a bond to be formed. In addition to the benefits discussed above, the direct bonding ability allows the openings 133 to expose only the conductive material of the die-bonding regions 128. That is, no portion of a bond finger or other conductive structure is exposed by the openings 133. As a result, the direct bond can further reduce the chance of corrosion (or other physical, electrical, and/or chemical damage) to the conductive materials in the metallization structures 120.

In the illustrated embodiment, the upper surfaces of the conductive vias 122 and/or the interconnects 124 each have a generally circular shape, each of which is individually exposed at the first surface 112 of the package substrate 110. In various other embodiments, the upper surfaces of the conductive vias 122 and/or the interconnects 124 can have various other suitable shapes (e.g., squares, rectangles, hexagons, and the like) and/or can be at least partially combined into a single shape (e.g., based on overlap between the upper surfaces). Purely by way of example, when the upper surfaces of the conductive vias 122 and/or the interconnects 124 have a square shape, they can be arranged in a grid such that the die-bonding region 128 is comprised of a substantially continuous bonding material.

Figure 2D:
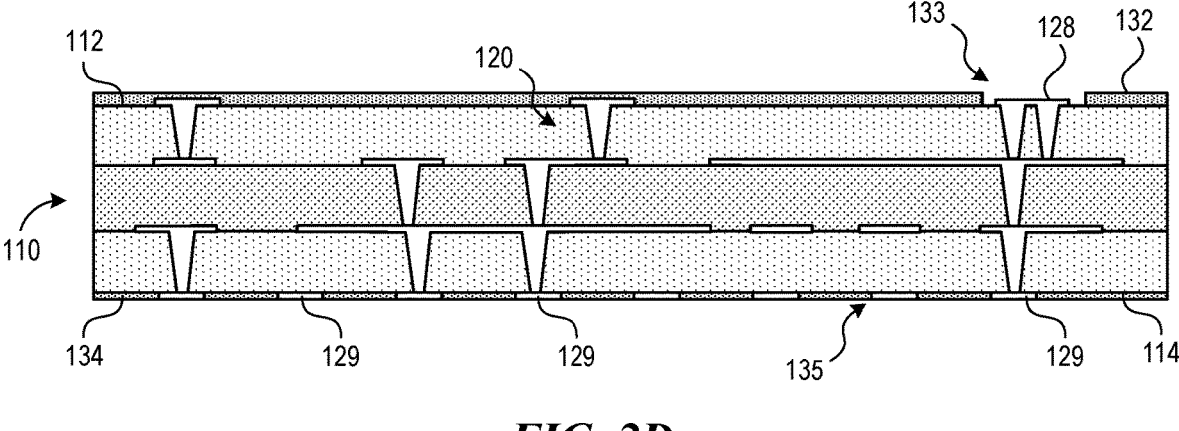
Figure 2E:
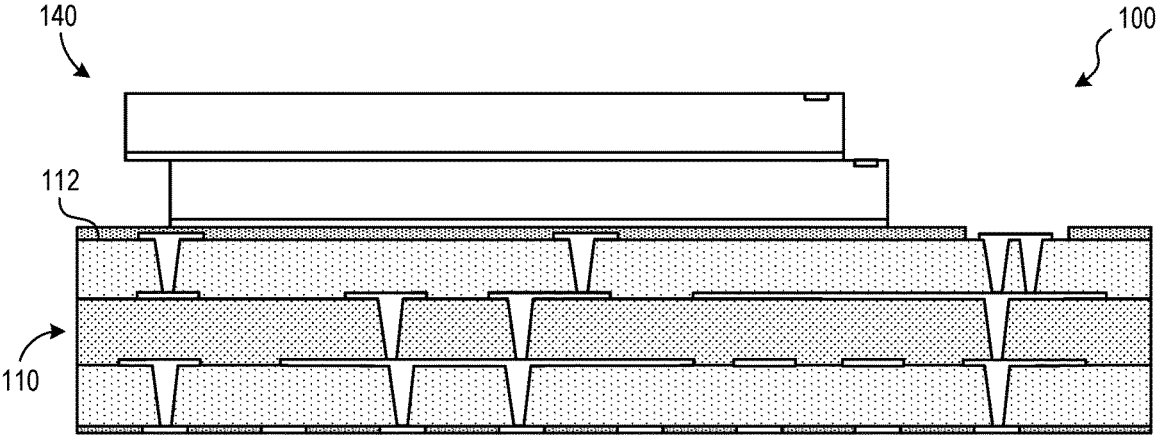
Figure 2F:
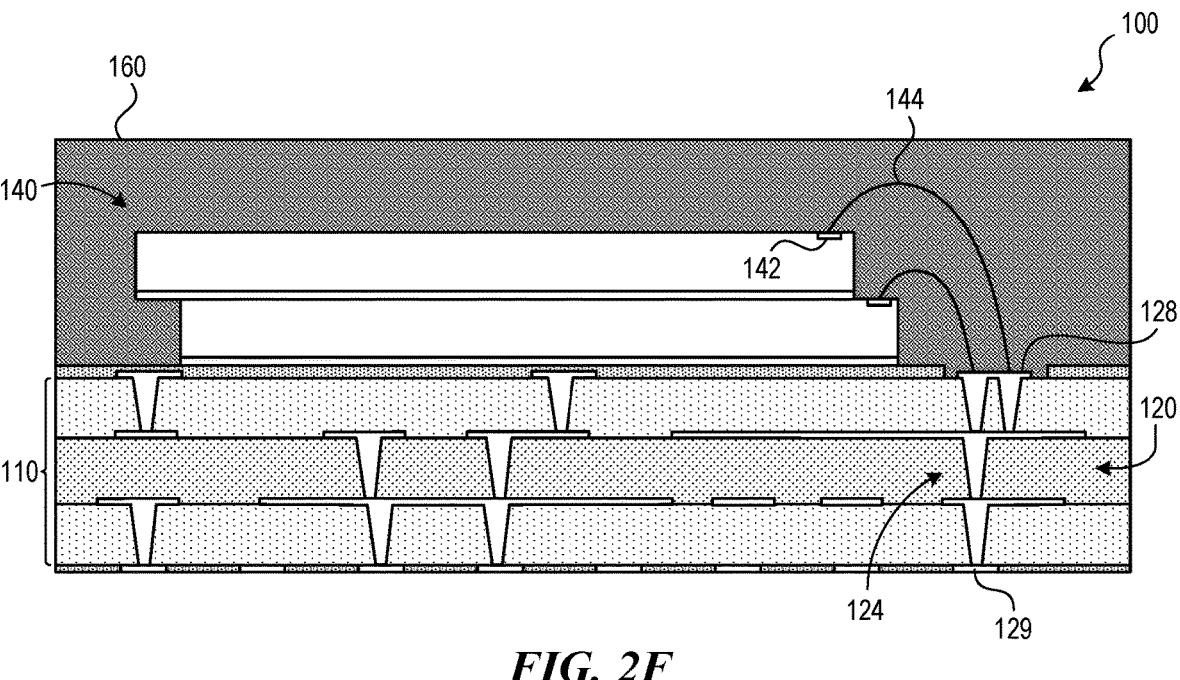
Figure 2G:
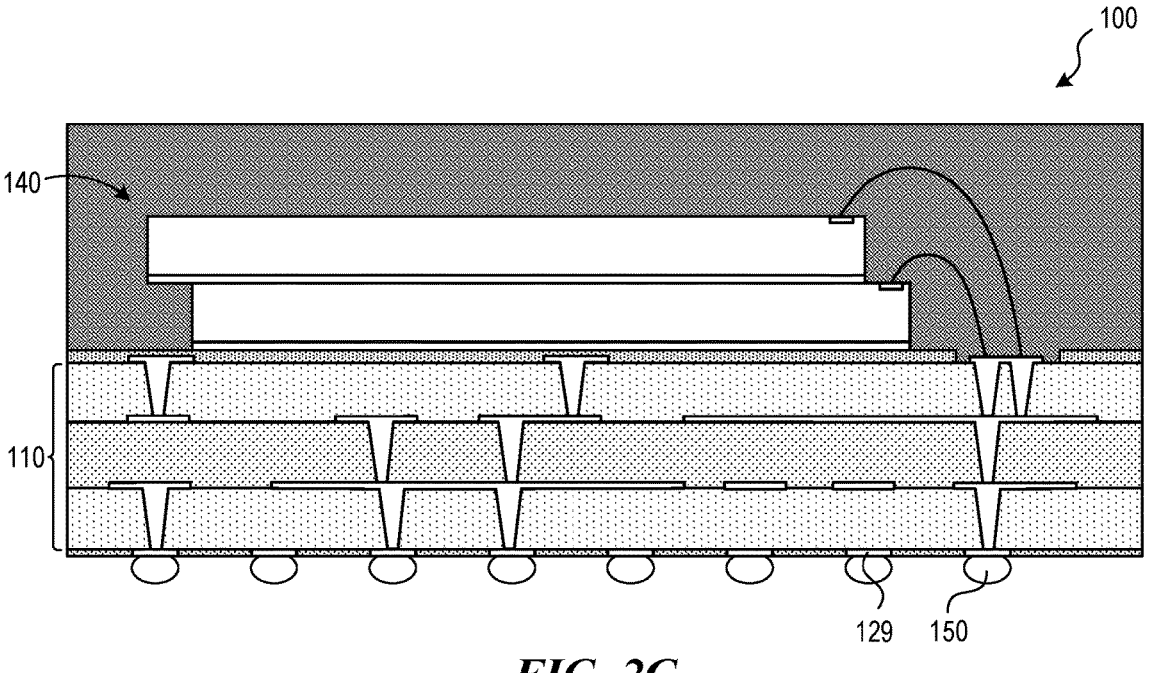

FIGS. 2A-2G are partially schematic cross-sectional views of illustrating a manufacturing process for a stacked semiconductor device in accordance with some embodiments of the present technology. More specifically, FIGS. 2A-2D illustrate a process for forming a package substrate of the type discussed above with respect to FIGS. 1A-1C, then FIGS. 2E-2G illustrate a process of forming a stacked semiconductor device with the package substrate. The manufacturing process illustrated in FIGS. 2A-2G can be utilized to manufacture a stacked semiconductor device of the type discussed above with respect to FIGS. 1A-1C (e.g., having direct bonds to features of the metallization structures 120).

FIG. 2A illustrates the package substrate 110 after depositing a first layer 116a and forming a first portion 220a of the metallization structures 120 on the first layer 116a. In some embodiments, forming the first portion 220a of the metallization structures 120 can include depositing a photoresist mask on the first layer 116a; patterning the photoresist mask; laser-drilling one or more vias in the first layer through the patterned photoresist mask; then filling the patterned photoresist mask with a conductive material. As illustrated in FIG. 2A, the resulting metallization structures 120 can include one or more vias 122 (one labeled), one or more traces 126 (one labelled), and/or a first section 224a of an interconnect 124.

As illustrated in FIGS. 2B and 2C, the deposition and formation process can be repeated to form any suitable number of layers in the package substrate 110. For example, FIG. 2B illustrates the package substrate 110 after depositing a second layer 116b over the first layer 116a and forming a second portion 220b of the metallization structures 120 on the second layer 116b. As further illustrated, the second portion 220b of the metallization structures 120 can include a second section 224b of the interconnect 124 directly over the first section 224a. Similarly, FIG. 2C illustrates the device 100 after depositing a third layer 116c over the second layer 116b and forming a third portion 220c of the metallization structures 120 on the third layer 116c. As further illustrated, the third portion 220c of the metallization structures 120 can include a third section 224c of the interconnect 124 directly over the second section 224b.

In the illustrated embodiment, the manufacturing process repeats the deposition and formation process twice to form three layers in the package substrate 110 each having a section of the metallization structures 120 formed thereon. In various other embodiments, the manufacturing process repeats the deposition and formation process any other suitable number of times. For example, the manufacturing process can include a single pass through the deposition and formation process, two passes, four passes, five passes, or any other suitable number of passes. Further, in some embodiments, not every deposition of a layer of the package substrate 110 is accompanied by a formation process for the metallization structures 120. For example, in some embodiments, the formation process skips a layer of the package substrate (e.g., thereby requiring the conductive vias 122 and/or sections of the interconnect 124 to extend through two layers 116).

FIG. 2D illustrates the package substrate 110 after forming one or more package-bonding regions 129 on the second surface 114 of the package substrate 110 and depositing the first and second insulation layers 132, 134. In the illustrated embodiment, the package-bonding regions 129 includes bond pads formed on the exposed portions of the metallization structures 120 to increase the surface area available for bonding. In some embodiments, the package-bonding regions 129 are the exposed lower surfaces of the metallization structures 120 and thereby do not require an additional formation process. In some embodiments, the package-bonding regions 129 include one or more traces and/or other redistribution features, allowing the metallization structures 120 to be coupled to package terminals across the second surface 114 of the package substrate 110.

As further illustrated in FIG. 2D, the first and second insulation layers 132, 134 can selectively expose portions of the die-bonding regions 128 and the package-bonding regions 129, respectively. For example, in the illustrated embodiment, the first insulation layer 132 includes one or more openings 133 (one shown) that exposes at least a portion of the die-bonding regions 128 while fully (or partially) covering at least a portion of the other metallization structures 120. As a result, the first insulation layer can allow one or more traces 126 to be formed on and fully protected at the first surface 112. Similarly, the second insulation layer 134 includes one or more openings 135 (eight shown) that each expose at least a portion of the package-bonding regions 129 on the second surface.

In the illustrated embodiment, the first insulation layer 132 is thicker than the metallization structures 120 on the first surface 112 while the second insulation layer 134 has a generally similar thickness to the metallization structures 120 on the second surface 114. In various other embodiments, however, the thickness of the first and second insulation layers 132, 134 can be varied based on the desired insulation. Purely by way of example, the second insulation layer 134 can be thicker than the metallization structures 120 on the second surface 114, thereby allowing the second insulation layer 134 to selectively expose the metallization structures 120.

FIG. 2E illustrates the device 100 after stacking one or more semiconductor dies on the first surface 112 of the package substrate 110 to form a die stack 140. In the illustrated embodiment, the die stack 140 includes two semiconductor dies offset in a staggered configuration. In various other embodiments, the die stack 140 can include one semiconductor die, three semiconductor dies, four semiconductor dies, eight semiconductor dies, and/or any other suitable number of semiconductor dies. Further, in embodiments with larger die stacks, the semiconductor dies can be offset and/or staggered in multiple directions.

FIG. 2F illustrates the device 100 after forming wirebonds 144 between the bond pads 142 in the die stack 140 and the die-bonding regions 128 of the metallization structures 120. As discussed above, because the conductive vias 122 and the interconnect 124 are completely filled with a conductive material, the die-bonding regions 128 can correspond to the upper surfaces of the conductive vias 122 and the interconnect 124. As a result, the wirebonds 144 can be coupled directly to the conductive vias 122 and the interconnect 124, rather than through a bond finger or other routing structure. As discussed above, by forming a direct connection to the upper surfaces of the conductive vias 122 and the interconnect 124, the manufacturing process can reduce the overall signal travel length and/or reduce the amount of conductive material exposed at the first surface 112 that can corrode and/or be otherwise damaged.

As further illustrated in FIG. 2F, an encapsulant 160 can be formed over at least a portion of the die stack 140 and the wirebonds 144. In the illustrated embodiment, the encapsulant 160 completely covers the die stack 140 and the wirebonds 144. In some embodiments, one or more components (e.g., one or more semiconductor dies and/or one or more portions of the wirebonds) are at least partially exposed after the encapsulant 160 is formed on the device 100. In various embodiments, the encapsulant can be an epoxy resin that is fully cured on the device 100, thereby providing insulation and/or protection to the die stack 140 and the wirebonds 144. For example, the encapsulant 160 can protect the die stack 140 from mechanical damage (e.g., during various singulation processes, transportation, package assembly processes, and the like).

FIG. 2G illustrates the device 100 after forming package terminals 150 on the package-bonding regions 129 of the metallization structures 120. The package terminals 150 allow the device 100 to be coupled to another semiconductor component, such as another stacked semiconductor package, a carrier, a motherboard, and the like. In the illustrated embodiment, the package terminals 150 are solder balls formed on the package-bonding regions 129. In various embodiments, the package terminals can have other suitable shapes, such as another solder structure, a conductive column, a bond pad for coupling to another conductive structure, and the like. In some embodiments, the device 100 does not include the package terminals 150. For example, the package-bonding regions 129 can be positioned to be joined to solder balls formed on another semiconductor component during a group reflow process.

Figure 3:
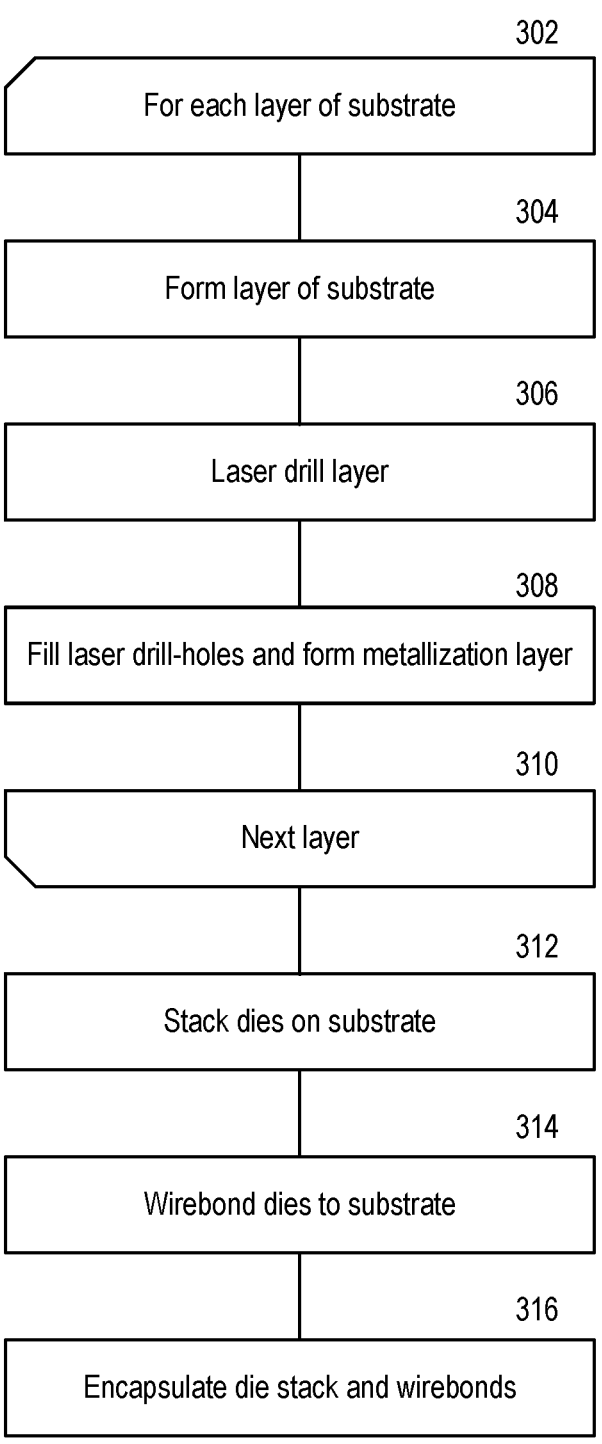
FIG. 3 is a flow diagram of a process for manufacturing for a stacked semiconductor device in accordance with some embodiments of the present technology.

FIG. 3 is a flow diagram of a process 300 for manufacturing for a stacked semiconductor device in accordance with some embodiments of the present technology. In the illustrated embodiment, the process 300 begins by looping through a layer-by-layer formation of a semiconductor substrate (e.g., the package substrate 110 of FIG. 1A and/or another suitable substrate) in blocks 302-310 for N-number of layers.

At block 304, the process 300 includes forming a layer of the semiconductor substrate. In some embodiments, forming the layer of the semiconductor substrate includes depositing and curing a layer of resin. In some embodiments, forming the layer of the semiconductor substrate includes a deposition and lamination process to connect the layer to any lower layers. In some embodiments, the lamination process includes applying heat and/or pressure to the new layer and/or any lower layers (e.g., placing the semiconductor substrate in a hydraulic press).

At block 306, the process 300 includes laser-drilling one or more holes in the newly formed layer of the semiconductor substrate. The depth of the holes can be controlled through the inclusion of a backstop (e.g., metallization features on a lower layer), controlling the exposure time, and/or controlling the power of the laser during the exposure. In some embodiments, the process 300 includes depositing and patterning a photoresist mask over the newly formed layer before laser-drilling the one or more holes. The photoresist mask can help protect the remainder of the newly formed layer from the laser-drilling process.

At block 308, the process 300 includes depositing a conductive material to form metallization structures on the newly formed layer of the semiconductor substrate. In embodiments that include depositing and patterning a photoresist mask at block 306, the deposition process at block 308 can fill the laser-drilled holes and the pattern in the photoresist mask to form the metallization structures. In some embodiments, the process 300 includes depositing and patterning a photoresist mask over the newly formed layer before depositing the conductive material to define traces and/or other conductive features. In some embodiments, the deposition process at block 308 fills only the laser-drilled holes (e.g., when a layer of the semiconductor substrate does not include any traces). Purely by way of example, the Nth layer (e.g., the final layer) may include only filling laser-drilled holes since the upper surfaces of the conductive vias and/or interconnects can be directly bonded to other features in the semiconductor device. After depositing the conductive material, the process 300 can include stripping the photoresist mask to expose the layer of the semiconductor substrate and the newly formed metallization structures.

At block 310, the process 300 moves to the next layer of the semiconductor substrate to repeat the layer-by-layer formation process. If no layers remain, (e.g., the previous layer was the Nth layer), the process continues to block 312. In some embodiments, the layer-by-layer formation of the semiconductor substrate in blocks 302-310 forms a semiconductor substrate corresponding to a single final semiconductor device. In other embodiments, the layer-by-layer formation of the semiconductor substrate in blocks 302-310 forms a semiconductor substrate with multiple regions each individually corresponding to a final semiconductor device. In various such embodiments, the semiconductor substrate can then be singulated before stacking dies at block 312, or can be singulated after completing the process 300 for each of the final semiconductor devices.

At block 312, the process 300 includes stacking one or more dies (or other suitable components, such as capacitors, transistors, and the like), on the semiconductor substrate. The semiconductor dies can be stacked using a die attach film, or any other suitable attachment mechanism. Additionally, the semiconductor dies can be stacked in a staggered configuration to allow the dies to be individually wirebonded to the semiconductor substrate and/or wirebonded through a series of wirebonds. In some embodiments, the stacking process at block 312 forms multiple die stacks on the semiconductor substrate corresponding to multiple semiconductor devices that can later be singulated.

At block 314, the process 300 includes electrically coupling the stacked dies (and/or any other suitable components) to the semiconductor substrate. As discussed above, the electrical coupling can be accomplished through one or more wirebonds between the dies and the metallization structures in the semiconductor substrate. As further discussed above, the wirebonds can be directly coupled to the conductive vias and/or interconnects in the semiconductor substrate.

At block 316, the process 300 includes encapsulating at least a portion of the die stack and the wirebonds. The encapsulation can provide insulation and/or protection to the die stack and the wirebonds. For example, the encapsulation can protect the electrical coupling between the wirebonds, the die stack, and the semiconductor substrate from mechanical damage during a singulation process in embodiments including multiple final semiconductor devices.

Figure 4:
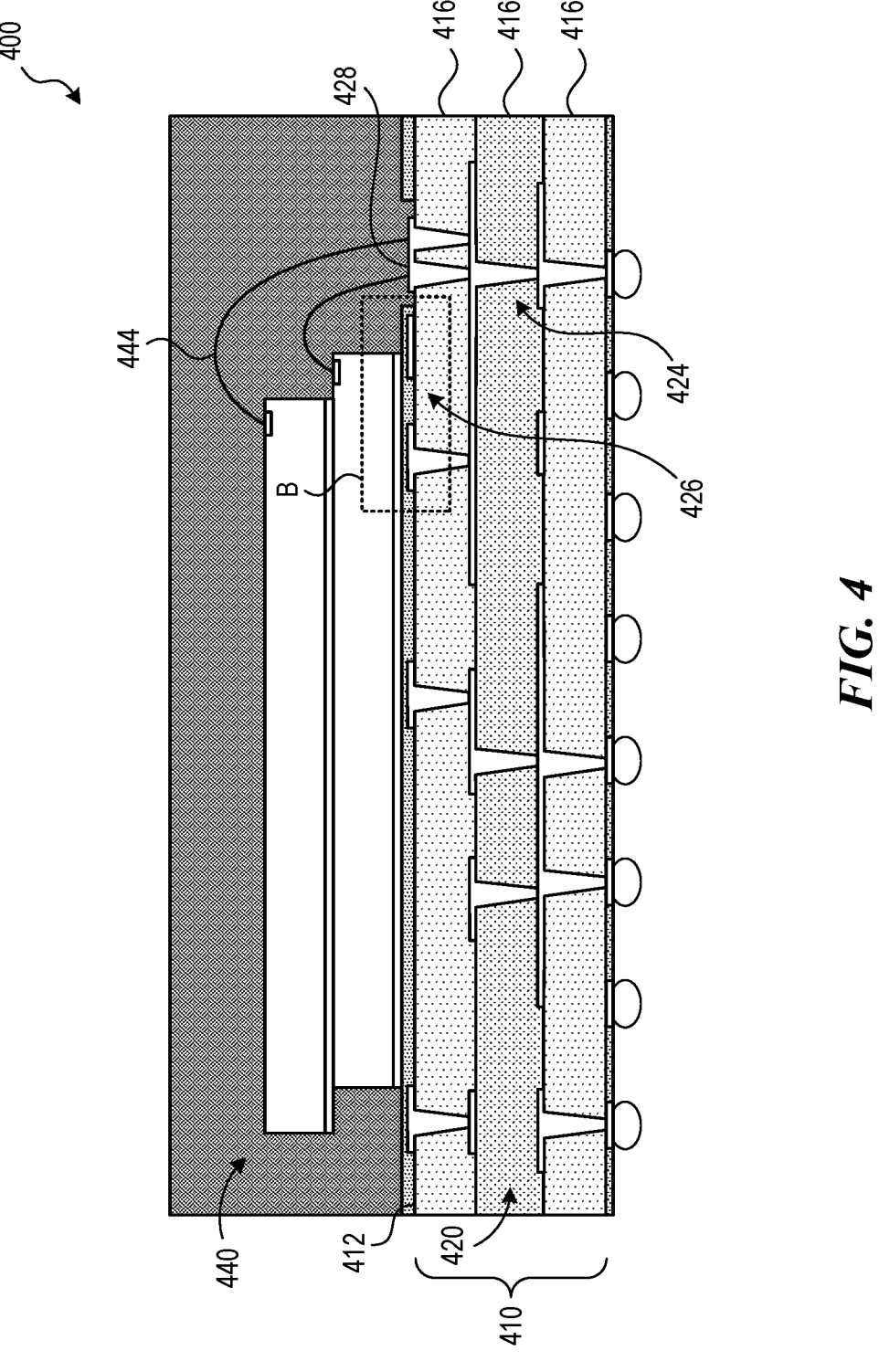
FIG. 4 is a partially schematic cross-sectional view of a stacked semiconductor device configured in accordance with further embodiments of the present technology.

FIG. 4 is a partially schematic cross-sectional view of a stacked semiconductor device 400 configured in accordance with further embodiments of the present technology. As illustrated in FIG. 4, the stacked semiconductor device 400 ("device 400") is generally similar to the device 100 discussed above with reference to FIG. 1A. For example, the device 400 includes a package substrate 410 that is composed of one or more layers 416 (three shown, referred to individually as "first-third layers 416a-416c"), various metallization structures 420 formed on the layers 416 of the package substrate 410, and a die stack 440 carried by a first surface 412 of the package substrate 410. Further, the die stack 440 is electrically coupled to die-bonding regions 428 of the metallization structures 420 through wirebonds 444. As discussed above, the die-bonding regions 428 can be the upper surfaces of an interconnect 424 and/or a conductive via 422 such that the wirebonds 444 are directly electrically coupled to the interconnect 424 and/or the conductive via 422.

In the illustrated embodiment, however, the metallization structures 420 also include one or more conductive traces 426 formed on the first surface 412 in a region B that is at least partially between the die-bonding regions 428 and the die stack 440. The direct bonding between the wirebonds 444 and the upper surface of the interconnect 424 and/or the conductive via 422 allow the traces 426 to be positioned in the illustrated region B. Absent the direct bond, for example, the region B would be occupied by a bond finger coupling a separate bonding region (e.g., a separate bond pad) to the interconnect and/or the conductive via. The newly available space therefore allows the traces 426 to be formed on the first surface 412 rather than, or in addition to, on a surface of the first or second layers 416a, 416b. Said another way, direct bonding between the wirebonds 444 and the upper surface of the interconnect 424 and/or the conductive via 422 allows additional traces 426 to be formed on the first surface 412. The position on the first surface 412 can be advantageous to help evaluate the traces 426 to identify problems in the metallization structures 420 (e.g., thereby helping prevent a malfunctioning package substrate from being used in later manufacturing), help control heat in the package substrate, and/or to provide additional signal routing space (e.g., for trace matching) in the package substrate 410.

Figure 5:
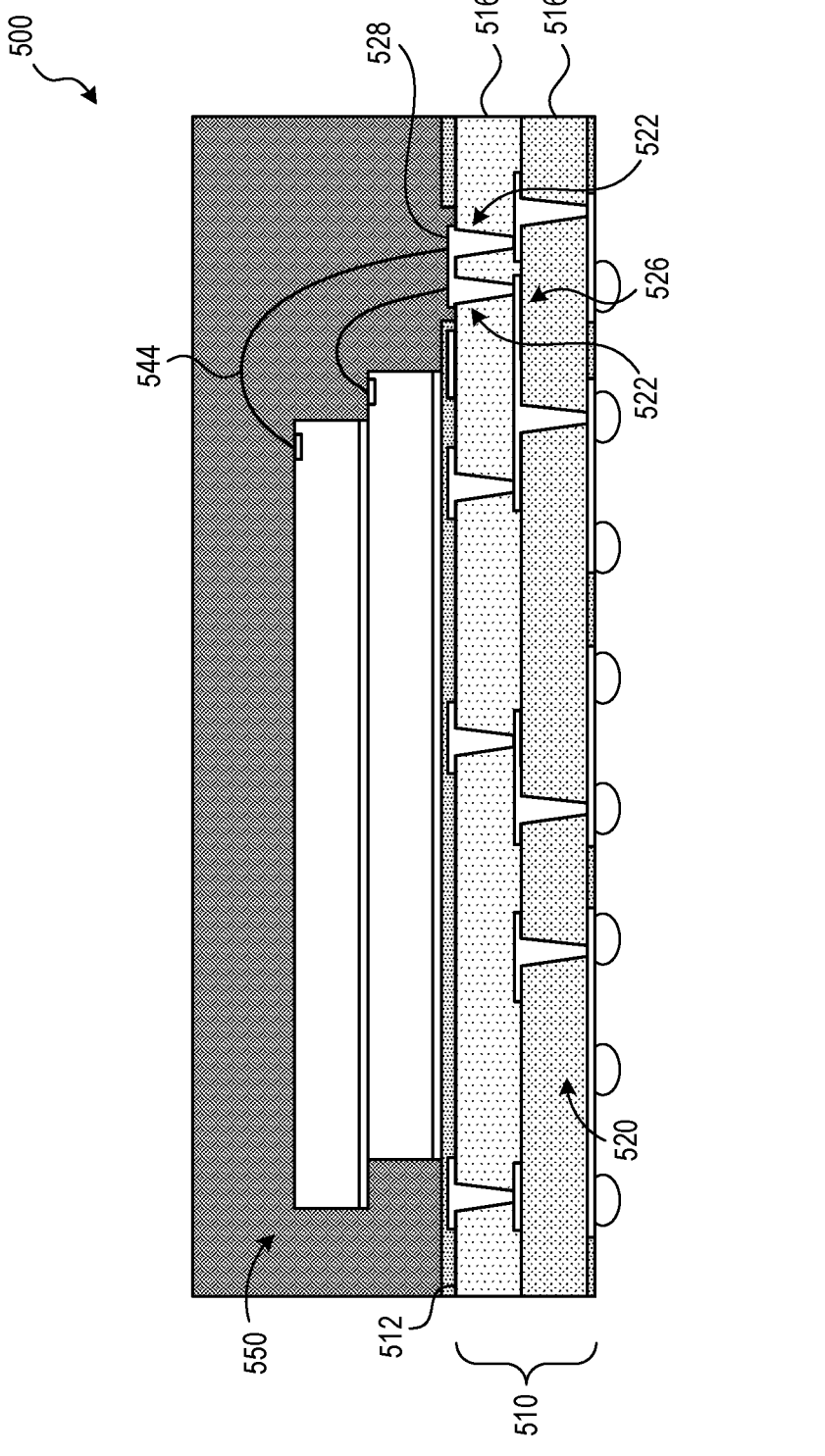
FIG. 5 is a partially schematic cross-sectional view of a stacked semiconductor device configured in accordance with further embodiments of the present technology.

FIG. 5 is a partially schematic cross-sectional view of a stacked semiconductor device 500 configured in accordance with further embodiments of the present technology. As illustrated in FIG. 5, the stacked semiconductor device 500 ("device 500") is generally similar to the device 100 discussed above with reference to FIG. 1A. For example, the device 500 includes a package substrate 510 that is composed of one or more layers 516 (two shown, referred to individually as "first and second layers 516a, 516b"), various metallization structures 520 formed on the layers 516 of the package substrate 510, and a die stack 540 carried by a first surface 512 of the package substrate 510. Further, the die stack 540 is electrically coupled to die-bonding regions 528 of the metallization structures 520 through wirebonds 544.

In the illustrated embodiment, however, the metallization structures 520 are comprised of multiple conductive vias 522 and conductive traces 526 forming signal route lines through the package substrate 510 (e.g., omitting an interconnect to form the signal route lines). As a result, for example, the wirebonds 544 are directly electrically coupled to the conductive vias 522 in the second layer 516b, which are in turn coupled to one or more traces 526 within the package substrate 510. The traces 526 are then coupled to the conductive vias 522 in the first layer 516a, thereby establishing a signal route through the package substrate 510.

In the illustrated embodiment, the conductive vias 522 in each of the layers 516 are not vertically aligned, thereby allowing the traces 526 to help control signal travel path lengths through the package substrate 510 (e.g., to maintain timing of signals). In various embodiments, one or more of the conductive vias 522 can be aligned vertically (e.g., to reduce a signal travel path between the layers 516).

Figure 6:
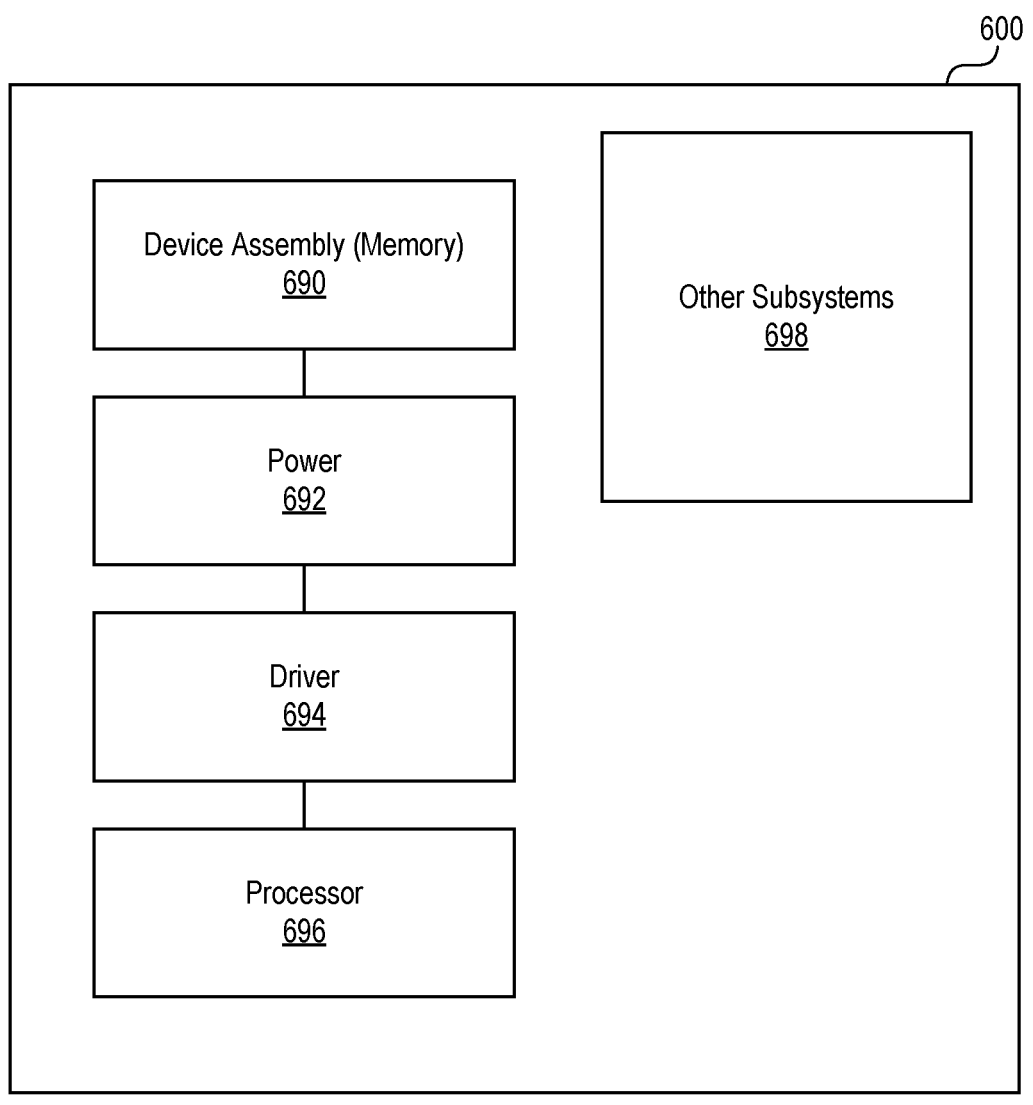
FIG. 6 is a schematic view of a system that includes a semiconductor die assembly configured in accordance with embodiments of the present technology.

FIG. 6 is a schematic view of a system that includes a semiconductor die assembly configured in accordance with embodiments of the present technology. The stacked semiconductor devices discussed above, or other semiconductor components with wirebonds directly bonded to conductive vias, can be incorporated into any of a myriad of larger and/or more complex systems, a representative example of which is system 600 shown schematically in FIG. 6. The system 600 can include a memory 690 (e.g., SRAM, DRAM, flash, and/or other memory devices), a power supply 692, a drive 694, a processor 696, and/or other subsystems or components 698. Stacked semiconductor devices having wirebonds directly coupled to the interconnect (e.g., of the type discussed above with respect to FIGS. 1A-5) can be included in any of the elements shown in FIG. 6. Purely by way of example, the memory 690 can include a stacked semiconductor device with memory dies that are wirebonded to a package substrate with direct connections to improve the quality and/or reduce the size of the memory 690.

The resulting system 600 can be configured to perform any of a wide variety of suitable computing, processing, storage, sensing, imaging, and/or other functions. Accordingly, representative examples of the system 600 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 600 include lights, cameras, vehicles, etc. With regard to these and other examples, the system 600 can be housed in a single unit or distributed over multiple interconnected units, e.g., through a communication network. The components of the system 600 can accordingly include local and/or remote memory storage devices and any of a wide variety of suitable computer-readable media.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same features and/or additional types of other features are not precluded. Further, the terms "approximately" and "about" are used herein to mean within at least within 10 percent of a given value or limit. Purely by way of example, an approximate ratio means within ten percent of the given ratio.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments.

Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A stacked semiconductor device, comprising:
   a package substrate, the package substrate comprising:
       a first layer including an outer surface, an inner surface opposite the outer surface, and a conductive trace at the inner surface;
       a second layer carried by the first layer, the second layer including a lower surface facing the inner surface of the first layer, an upper surface opposite the lower surface;
       a conductive via extending from the lower surface to the upper surface, wherein the conductive via is electrically coupled to the conductive trace at the lower surface, and wherein a top end of the conductive via is exposed at the upper surface; and
       an interconnect extending from the upper surface to the outer surface, wherein the interconnect includes:
           a first section of an interconnect formed in the first layer; and
           a second section of the interconnect formed in the second layer, wherein the second section of the interconnect is directly coupled to the first section at the inner surface, and wherein the interconnect is electrically coupled to the conductive trace at the inner surface;
   a stack of dies carried by the upper surface;
   one or more first wirebonds electrically coupling the stack of dies to the top end of the conductive via; and
   one or more second wirebonds electrically coupling the stack of dies to the second section of the interconnect at the upper surface.

2. The stacked semiconductor device of claim 1 wherein the one or more first wirebonds are electrically coupled directly to the top end of the conductive via.

3. The stacked semiconductor device of claim 1 wherein:
   the first section of the interconnect includes a first end with a first diameter and a second end with a second diameter larger than the first diameter;
   the second section of the interconnect includes a third end having a third diameter smaller than the second diameter and a fourth end with a fourth diameter larger than the third diameter, wherein the third end is directly coupled to the second end of the first section, and wherein the fourth end is exposed at the upper surface of the second layer.

4. The stacked semiconductor device of claim 3 wherein the first end of the first section of the interconnect is coupled to a bond pad at a lower surface of the package substrate to define a straight signal line through the package substrate from the bond pad to the one or more second wirebonds.

5. The stacked semiconductor device of claim 1 wherein the first layer further includes a second conductive via extending from the outer surface to the inner surface, wherein the second conductive via is electrically coupled to the conductive trace at the inner surface.

6. The stacked semiconductor device of claim 5 wherein the second conductive via is not vertically aligned with the conductive via in the second layer of the package substrate.

7. The stacked semiconductor device of claim 1 wherein the second layer further includes a plurality of signal routing lines at the upper surface, wherein the stacked semiconductor device further comprises an insulation layer at least partially covering the plurality of signal routing lines, and wherein the stack of dies is at least partially vertically aligned with the plurality of signal routing lines.

8. A method for forming a stacked semiconductor device, the method comprising:

stacking one or more semiconductor dies on an upper surface of a package substrate adjacent to an exposed top surface of a conductive via extending through at least one layer of the package substrate;

forming one or more first wirebonds between the one or more semiconductor dies and the top surface of the conductive via, wherein each of the one or more wirebonds include a first portion coupled to a bond pad on one of the one or more semiconductor dies and a second portion directly coupled to the top surface; and forming one or more second wirebonds between the one or more semiconductor dies and a bonding surface of an interconnect exposed at the upper surface of the package substrate, wherein the interconnect extends through the package substrate, and wherein the conductive via is electrically coupled to the interconnect by a conductive layer at an intermediate layer of the package substrate.

9. The method of claim 8 wherein:

the package substrate further comprises two or more layers; and the interconnect extends through the two or more layers, wherein the interconnect comprises:

a first section having a first end with a first diameter and a second end with a second diameter larger than the first diameter; and a second section including a third end having a third diameter smaller than the second diameter and a fourth end with a fourth diameter larger than the third diameter, wherein the third end is electrically coupled to the second end of the first section, and wherein the fourth end includes an upper surface of the interconnect.

10. The method of claim 9, further comprising forming the package substrate, wherein forming the package substrate comprises, for each of N-number of layers, where N is an integer greater than one:

depositing a layer of the package substrate;

laser-drilling the layer to create one or more vias in the layer; and depositing a conductive material into the one or more vias, wherein at least one via in each of the N-number of layers is vertically aligned to form the interconnect, and wherein each of the aligned vias corresponds to a section of the interconnect.

11. The method of claim 10 wherein forming the package substrate further comprises forming one or more conductive traces on each layer of the package substrate while depositing the conductive material into the one or more vias.

12. The method of claim 11 wherein at least a portion of the one or more conductive traces on the Nth layer of the package substrate is positioned laterally between the top surface of the conductive via and the one or more semiconductor dies.

13. A stacked semiconductor device, comprising:

a package substrate having N-number of layers, wherein N is a positive integer greater than or equal to two, and wherein:

each of the N-number of layers comprises;

a conductive via, wherein each conductive via has a first end with a first diameter and a second end with a second diameter greater than the first diameter; and a section of an interconnect extending through the package substrate; and the N−1 layer of the package substrate further comprises a redistribution layer having one or more signal routing lines electrically coupled between the conductive via and the section of the interconnect at the Nth layer;

a stack of dies carried by an upper surface of the package substrate;

one or more first wirebonds electrically coupling the stack of dies to the second end of the conductive via in the Nth layer of the package substrate; and one or more second wirebonds electrically coupling the stack of dies to an upper end of the interconnect.

14. The stacked semiconductor device of claim 13 wherein the redistribution layer further includes one or more signal routing lines electrically coupled between the conductive via at the N−1 layer and the conductive via at the Nth layer.

15. The stacked semiconductor device of claim 13 wherein each of the conductive vias has a frustoconical shape.

16. The stacked semiconductor device of claim 13 wherein the N-number of layers includes a first layer with a first segment of the interconnect, wherein the stacked semiconductor device further comprises a package terminal electrically coupled to the first section of the interconnect at a lower surface of the package substrate, and wherein the interconnect provides a straight signal travel line between the package terminal and the one or more wirebonds.

17. The stacked semiconductor device of claim 13 wherein the one or more first wirebonds are coupled directly to a conductive material in the conductive via in the Nth layer of the package substrate.

18. The stacked semiconductor device of claim 13 wherein each of the N-number of layers further comprises one or more signal routing lines.

* * * * *